(12) United States Patent
Tseng et al.

(10) Patent No.: US 9,824,931 B2
(45) Date of Patent: Nov. 21, 2017

(54) SEMICONDUCTOR DEVICE AND METHOD FOR FABRICATING THE SAME

(71) Applicant: UNITED MICROELECTRONICS CORP., Hsin-Chu (TW)

(72) Inventors: I-Ming Tseng, Kaohsiung (TW); Wen-An Liang, Tainan (TW); Chen-Ming Huang, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/981,929

(22) Filed: Dec. 29, 2015

(65) Prior Publication Data

US 2017/0154823 A1 Jun. 1, 2017

(30) Foreign Application Priority Data

Nov. 26, 2015 (CN) .......................... 2015 1 0843189

(51) Int. Cl.
| | |
|---|---|
| *H01L 29/06* | (2006.01) |
| *H01L 29/78* | (2006.01) |
| *H01L 27/088* | (2006.01) |
| *H01L 21/762* | (2006.01) |
| *H01L 21/8234* | (2006.01) |
| *H01L 21/76* | (2006.01) |
| *H01L 21/28* | (2006.01) |

(Continued)

(52) U.S. Cl.
CPC .. *H01L 21/823481* (2013.01); *H01L 21/0228* (2013.01); *H01L 21/31105* (2013.01); *H01L 21/82345* (2013.01); *H01L 21/823431* (2013.01); *H01L 21/823437* (2013.01); *H01L 21/823456* (2013.01); *H01L 27/0886* (2013.01); *H01L 29/0649* (2013.01); *H01L 29/4966* (2013.01); *H01L 29/66545* (2013.01); *H01L 29/66795* (2013.01); *H01L 29/785* (2013.01); *H01L 29/7851* (2013.01); *H01L 29/0653* (2013.01)

(58) Field of Classification Search
CPC ............ H01L 29/66795; H01L 29/785; H01L 21/823431; H01L 27/0886; H01L 21/845; H01L 27/1211; H01L 21/823821; H01L 27/0924; H01L 27/10876
See application file for complete search history.

(56) References Cited

U.S. PATENT DOCUMENTS 9,362,181 B1 * 6/2016 Xie .................. H01L 21/823878
9,368,496 B1 * 6/2016 Yu ........................ H01L 27/0886
(Continued)

OTHER PUBLICATIONS

Tseng, Title of Invention: Semiconductor Device and Method for Fabricating the Same, U.S. Appl. No. 14/684,445, filed Apr. 13, 2015.

(Continued)

*Primary Examiner* — Victor A Mandala
*Assistant Examiner* — Regan J Rundio
(74) *Attorney, Agent, or Firm* — Winston Hsu

(57) ABSTRACT

A method for fabricating semiconductor device is disclosed. The method includes the steps of: providing a substrate having a fin-shaped structure thereon; forming a first shallow trench isolation (STI) around the fin-shaped structure; dividing the fin-shaped structure into a first portion and a second portion; and forming a second STI between the first portion and the second portion.

12 Claims, 6 Drawing Sheets

(51) Int. Cl.
*H01L 29/66* (2006.01)
*H01L 21/02* (2006.01)
*H01L 21/311* (2006.01)
*H01L 29/49* (2006.01)

(56) References Cited

U.S. PATENT DOCUMENTS

| | | | |
|---|---|---|---|
| 2009/0159959 A1* | 6/2009 | Park | H01L 27/11565 257/324 |
| 2015/0115373 A1* | 4/2015 | Yu | H01L 21/823418 257/401 |
| 2015/0214341 A1* | 7/2015 | Shin | H01L 29/66818 257/401 |
| 2015/0294969 A1* | 10/2015 | Lee | H01L 27/0886 257/401 |
| 2016/0079125 A1* | 3/2016 | Kim | H01L 21/823431 438/283 |
| 2016/0111336 A1* | 4/2016 | Chang | H01L 21/823481 257/401 |
| 2016/0155739 A1* | 6/2016 | Ting | H01L 27/0886 257/401 |

OTHER PUBLICATIONS

Tseng, Title of Invention: Semiconductor Device and Method for Fabricating the Same, U.S. Appl. No. 14/844,004, filed Sep. 3, 2015.

* cited by examiner

US 9,824,931 B2

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly, to a method for fabricating shallow trench isolation (STI) between fin-shaped structures.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

In current FinFET fabrication, fin-shaped structure may be divided and insulating material is deposited to form shallow trench isolation (STI). However, the STI formed between fin-shaped structures often results in expansion and affects the formation of gate structure thereafter. Hence, how to improve the current FinFET fabrication and structure for resolving this issue has become an important task in this field.

SUMMARY OF THE INVENTION

According to a preferred embodiment of the present invention, a method for fabricating semiconductor device is disclosed. The method includes the steps of: providing a substrate having a fin-shaped structure thereon; forming a first shallow trench isolation (STI) around the fin-shaped structure; dividing the fin-shaped structure into a first portion and a second portion; and forming a second STI between the first portion and the second portion.

According to another aspect of the present invention, a semiconductor device is disclosed. The semiconductor device includes: a substrate; a fin-shaped structure on the substrate, in which the fin-shaped structure includes a first portion and a second portion; and a first shallow trench isolation (STI) between the first portion and the second portion of the fin-shaped structure, in which the first STI comprises an overhang.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
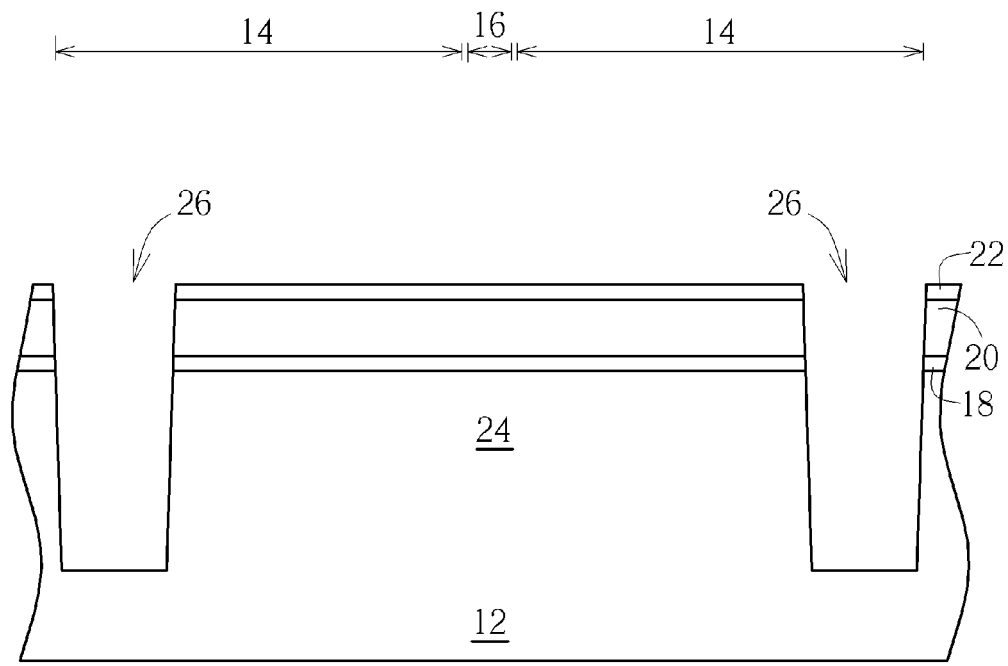
FIGS. 1-10 illustrate a method for fabricating semiconductor device according to a preferred embodiment of the present invention.

Referring to FIGS. 1-10, FIGS. 1-10 illustrate a method for fabricating semiconductor device according to a preferred embodiment of the present invention. As shown in FIG. 1, a substrate 12, such as silicon substrate or silicon-on-insulator (SOI) substrate is provided, and a first region 14 and a second region 16 are defined on the substrate 12. Preferably, the second region 16 is used to form STI between fin-shaped structures in the later process while the first region 14 being the region adjacent to the second region 16, is primarily serving as the active region used to form FinFET devices afterwards.

Next, a liner oxide 18, a liner nitride 20, and a hard mask 22 composed of oxides are sequentially deposited on the substrate 12, and a photo-etching process is conducted to remove part of the hard mask 22, part of the liner nitride 20, and part of the liner oxide 18 to form fin-shaped structure 24 and a trench 26 around the fin-shaped structure 24.

Figure 2:
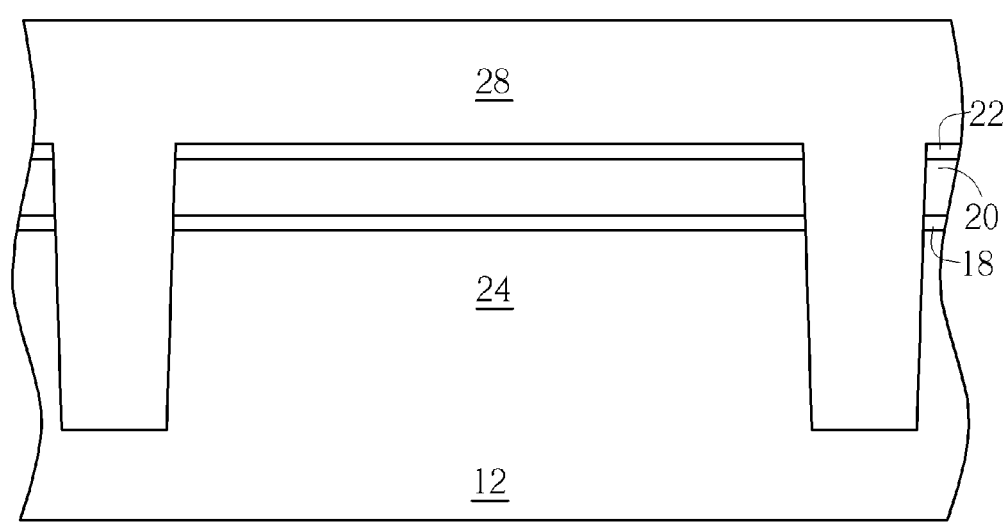

Next, as shown in FIG. 2, a flowable chemical vapor deposition (FCVD) process is conducted to form an insulating layer 28 on the hard mask 22 and filling the trench 26. Preferably, the insulating layer 28 is composed of oxides such as $SiO_2$, but not limited thereto.

Figure 3:
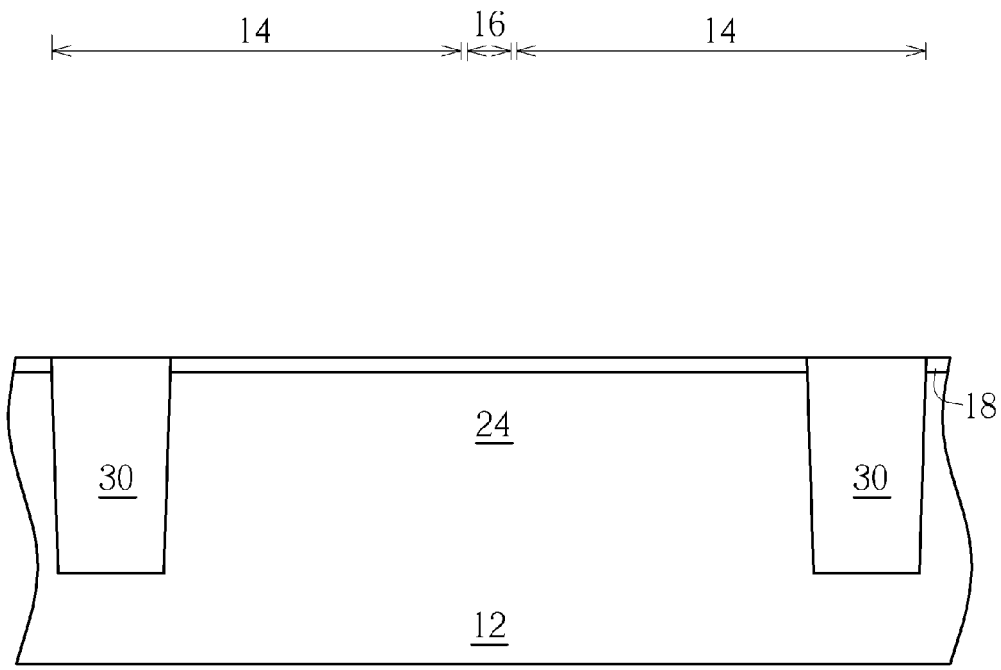

Next, as shown in FIG. 3, a planarizing process, such as chemical mechanical polishing (CMP) process is conducted to remove part of the insulating layer 28, hard mask 22, and liner nitride 20 so that the top surface of the remaining insulating layer 28 is even with the top surface of the liner oxide 18. This forms a STI 30 around the fin-shaped structure 24.

Figure 4:
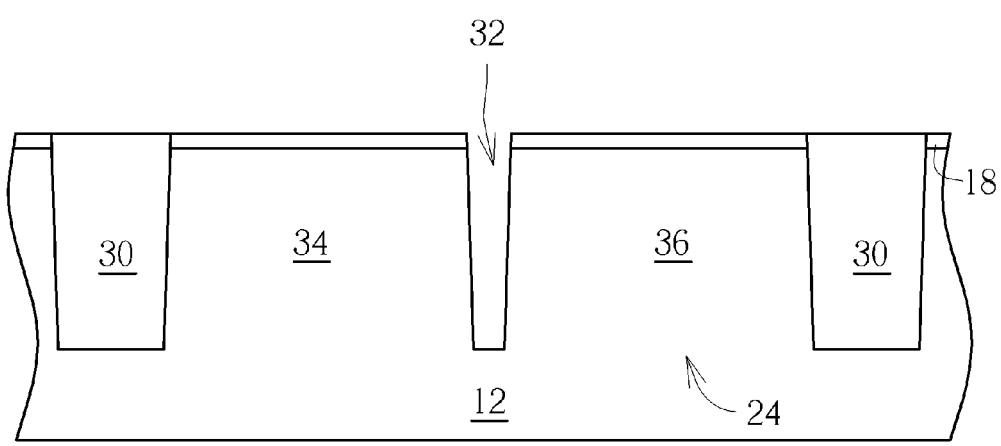

Next, as shown in FIG. 4, a photo-etching process is conducted by first forming a patterned mask (not shown) on part of the fin-shaped structure 24 and STI 30 and expose the second region 16, and then conducting an etching process to remove part of the liner oxide 18 and part of the fin-shaped structure 24 not covered by the patterned mask to form a trench 32 in the fin-shaped structure 24 while dividing the fin-shaped structure 24 into a first portion 34 and a second portion 36.

Figure 5:
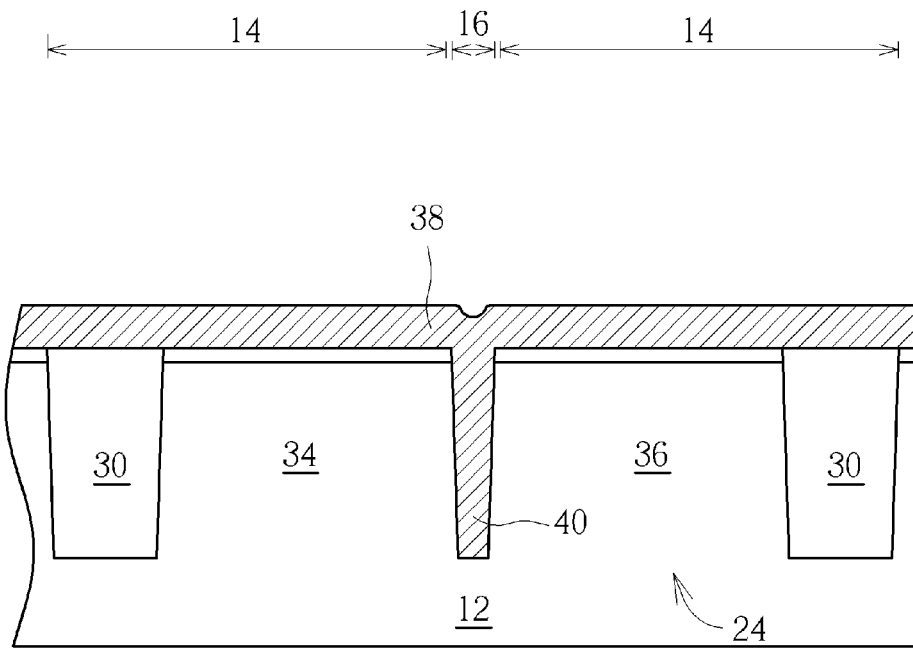

Next, as shown in FIG. 5, an atomic layer deposition (ALD) process is conducted to form an insulating layer 38 on the first portion 34 and second portion 36 and filling the trench 32. In this embodiment, the insulating layer 38 is preferably composed of oxides such as $SiO_2$, but not limited thereto.

Figure 6:
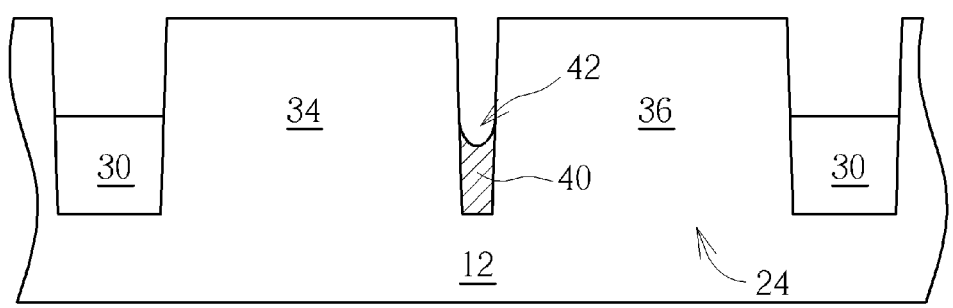

Next, as shown in FIG. 6, an etching process is conducted to remove part of the insulating layer 38 and part of the STI 30 so that the top surface of the STI 30 is slightly lower than the top surface of the fin-shaped structure 24 and forms another STI 40 on the second region 16, in which the STI 40 is preferably formed between the first portion 34 and second portion 36 of the fin-shaped structure 24. It should be noted that since the STI 40 between the first portion 34 and second portion 36 is formed by ALD process while the STI 30 is formed by FCVD process, the STI 30 formed on the first region 14 preferably maintains a planar surface while the STI 40 formed on the second region 16 includes an overhang portion 42 as a result of different etching selectivity between the two processes.

Figure 7:
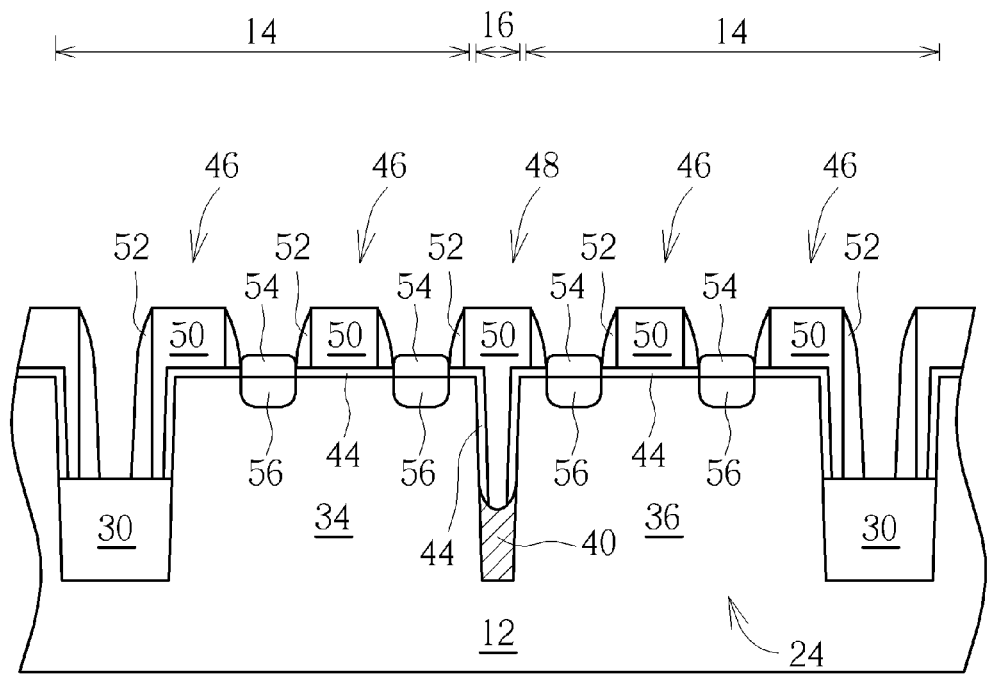

Next, as shown in FIG. 7, a gate insulating layer 44 is formed on the top surface of first portion 34 and second portion 36 of fin-shaped structure 24 as well as the sidewalls of fin-shaped structure 24, gate structures 46 are formed on the fin-shaped structure 24 on first region 14, and gate structures 48 is formed on the STI 40 on second region 16.

The fabrication of the gate structures 46, 48 could be accomplished by a gate first process, a high-k first approach from gate last process, or a high-k last approach from gate last process. Since this embodiment pertains to a high-k last approach, gate structures 46, 48 containing polysilicon material 50 could be first formed on the fin-shaped structure 24 and STI 40, and spacers 52 are formed adjacent to the gate structures 46, 48. In this embodiment, the spacers 52 could be selected from the group consisting of $SiO_2$, SiN, SiON, and SiCN, but not limited thereto.

Next, a source/drain region 54 and/or epitaxial layer 56 are formed in the fin-shaped structure 24 and/or substrate 12 adjacent to two sides of the spacers 52, and a silicide (not shown) is selectively formed on the surface of the source/drain region 54 and/or epitaxial layer 56.

Figure 8:
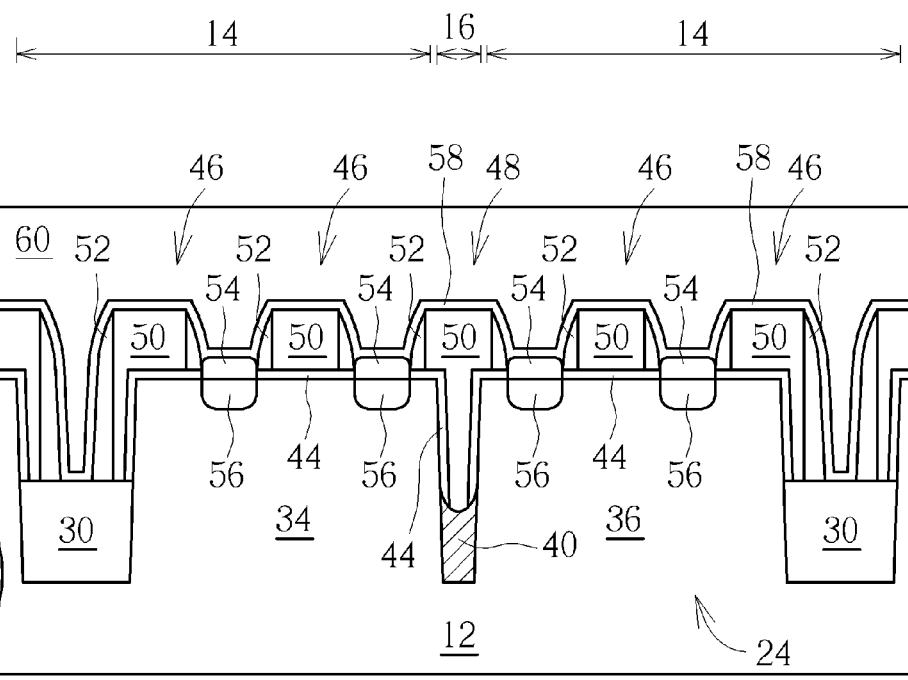

Next, as shown in FIG. 8, a contact etch stop layer (CESL) 58 is deposited on the gate structures 46, 48 and substrate 12, in which the CESL 58 is preferably composed of stress material. For instance, the CESL 58 could be selected from the group consisting of SiN and SiCN, but not limited thereto.

Next, an interlayer dielectric (ILD) layer 60 is formed on the CESL 58 and fin-shaped structure 24, and a planarizing process such as CMP is conducted to remove part of the ILD layer 60 and part of the CESL 58 so that the gate electrodes composed of polysilicon material 50 are exposed and the top surfaces of the gate electrodes and ILD layer 60 are coplanar. The ILD layer 60 could be composed of insulating material containing any oxides, such as tetraethyl orthosilicate (TEOS), but not limited thereto.

Figure 9:
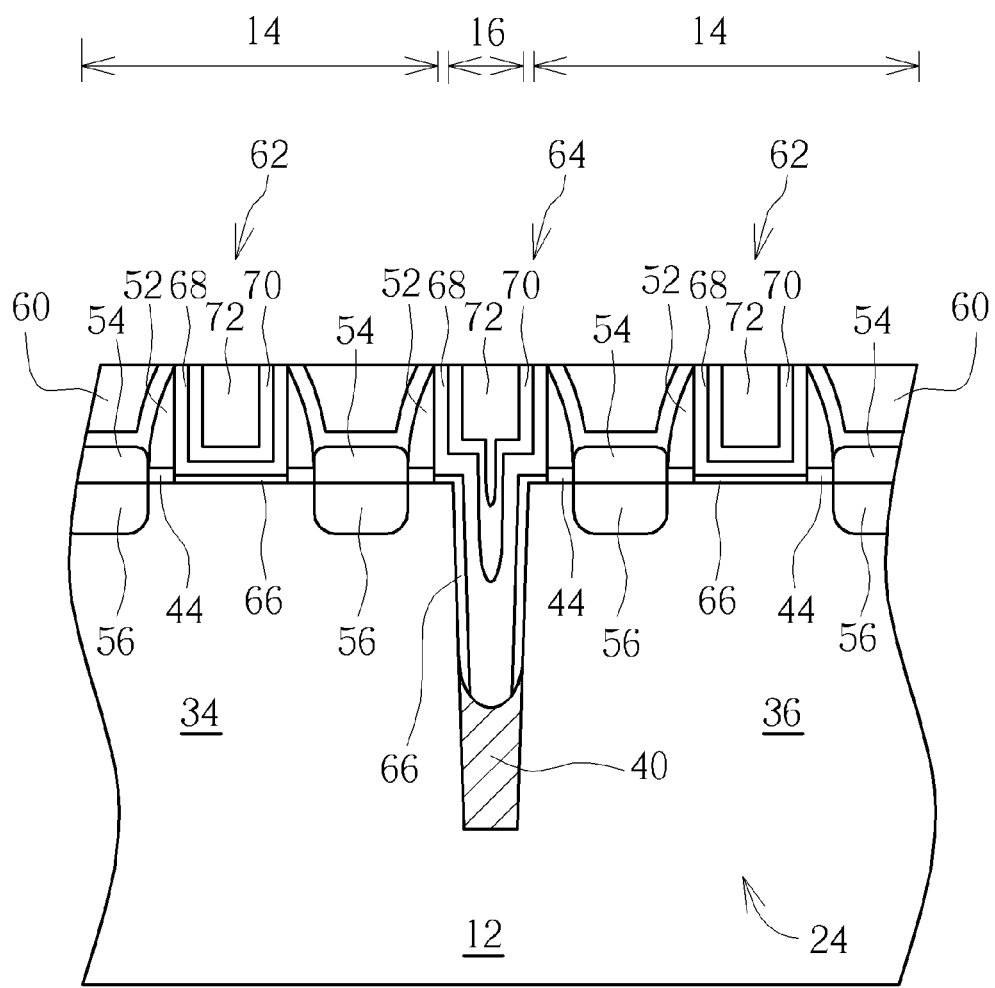

Next as shown in FIG. 9, a replacement metal gate (RMG) process is conducted to transform the gate structures 46, 48 into metal gates 62, 64. The RMG process could be accomplished by first performing a selective dry etching or wet etching process by using etchants including ammonium hydroxide ($NH_4OH$) or tetramethylammonium hydroxide (TMAH) to remove the polysilicon material 50 from gate structures 46, 48 for forming recesses (not shown) in the ILD layer 60. Next, an interfacial layer 66, a high-k dielectric layer 68, and a conductive layer including at least a U-shaped work function metal layer 70 and a low resistance metal layer 72 are formed in the recesses, in which the interfacial layer 66 is preferably deposited on the sidewalls of the first portion 34 and second portion 36. Next, a planarizing process is conducted so that the surfaces of the U-shaped high-k dielectric layer 68, the U-shaped work function layer 70 and low resistance metal layer 72 are even with the surface of the ILD layer 60.

In this embodiment, the high-k dielectric layer 68 is preferably selected from dielectric materials having dielectric constant (k value) larger than 4. For instance, the high-k dielectric layer 68 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 70 is formed for tuning the work function of the later formed metal gates to be appropriate in an NMOS or a PMOS. For an NMOS transistor, the work function metal layer 70 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 70 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 70 and the low resistance metal layer 72, in which the material of the barrier layer may include titanium (Ti), titanium nitride (TiN), tantalum (Ta) or tantalum nitride (TaN). Furthermore, the material of the low-resistance metal layer 72 may include copper (Cu), aluminum (Al), titanium aluminum (TiAl), cobalt tungsten phosphide (CoWP) or any combination thereof. Since the process of using RMG process to transform dummy gate into metal gate is well known to those skilled in the art, the details of which are not explained herein for the sake of brevity.

Figure 10:
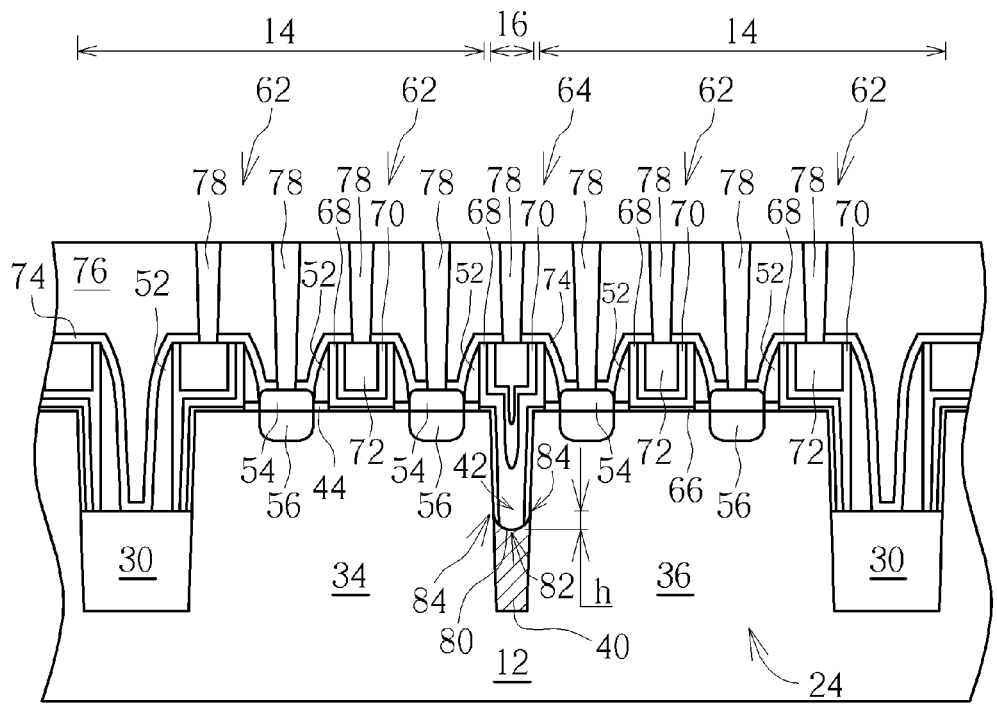

Next, as shown in FIG. 10, the ILD layer 60 and CESL 58 could be removed, and another CESL 74 and another ILD layer 76 are deposited on the metal gates 62, 64. Next, a contact plug formation is conducted by first forming a plurality of contact holes (not shown) in the ILD layer 76 and CESL 74, and metals including a barrier layer (not shown) selected from the group consisting of Ti, TiN, Ta, and TaN and a metal layer (not shown) selected from the group consisting of W, Cu, Al, TiAl, and CoWP are sequentially deposited into the contact holes. After the barrier layer and metal layer are deposited, a planarizing process, such as CMP process is conducted to remove part of the barrier layer and part of the metal layer to form contact plugs 78 electrically connected to the metal gates 62, 64 and source/drain regions 54 and epitaxial layer 56 in the substrate 12.

Referring again to FIG. 10, which further illustrates a structural view of a semiconductor device according to a preferred embodiment of the present invention. As shown in FIG. 10, the semiconductor device includes a fin-shaped structure 24 on the substrate 12 while the fin-shaped structure 24 includes a first portion 34 and a second portion 36, a STI 30 around the first portion 34 and second portion 36, a STI 40 between the first portion 34 and second portion 36, a gate insulating layer 44 on the first portion 34 and second portion 36, and metal gates 62, 64 on the first region 14 and second region 16 respectively.

In this embodiment, since the gate insulating layer 44 and interfacial layer 66 are formed at different stage of the process, the thickness of the gate insulating layer 44 is preferably greater than the thickness of the interfacial layer 66. Moreover, the top surface of the metal gates 62 on the first region 14 and the top surface of the metal gate 64 on second region 16 are coplanar, and each of the metal gates 62, 64 further includes a high-k dielectric layer 68 on the interfacial layer 66, a work function metal layer 70, and a low resistance metal layer 72. Preferably, the metal gate 64 on the second region 16 has a high-k dielectric layer 68 contacting the interfacial layer 66 and STI 40 directly.

If viewing from a detailed perspective, the STI 40 disposed on the first portion 34 and second portion 36 preferably includes an overhang 42 or overhang portion, in which the overhang 42 includes a surface 80 concave upward. The surface 80 concave upward further includes a valley point 82 and two peak points 84, in which the two peak points 84 contact the sidewalls of the first portion 34 and second portion 36 respectively.

If viewing from an overall perspective, the STI 40 is formed by ALD process thereby having the aforementioned overhang 42 portion, whereas the STI 30 around the first portion 34 and second portion 36 is formed by FCVD process thereby having a planar surface. If comparing with the position of the STI 40, the top surface of the STI 30 is preferably even with the two peak points 84 of the surface 80 concave upward, or the valley point 82 of the surface 80 concave upward is slightly lower than the top surface of the STI 30. According to a preferred embodiment of the present invention, the height h measured from the valley point 82 to the horizontal plane of the top surface of STI 30 is less than 10 nm.

Figure 11:
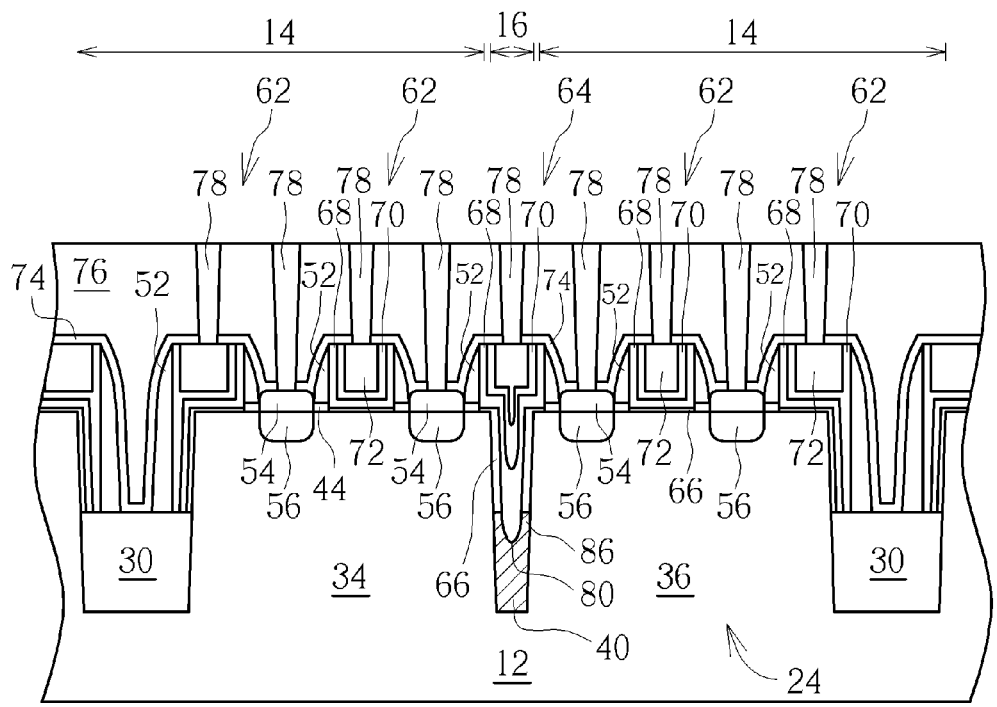
FIG. 11 illustrates a structural view of a semiconductor device according to an embodiment of the present invention.

Referring to FIG. 11, FIG. 11 illustrates a structural view of a semiconductor device according to an embodiment of the present invention. In contrast to the two peak points 84 of the surface 80 concave upward from FIG. 10 contacting the sidewalls of the first portion 34 and second portion 36 directly, protrusions 86 are formed between the surface 80 concave upward and sidewalls of the first portion 34 and second portion 36 in this embodiment, in which the top surface of each protrusion 86 is aligned or even with the top surface of STI 30 and the top surface of each protrusion 86 preferably being a planar surface.

In conventional art, after a fin-shaped structure is separated or divided into two portions, a FCVD process is typically employed to form STI between the divided fin-shaped structures and around the fin-shaped structures. The FCVD process however carries oxygen atoms and after the oxygen atoms are treated by thermal anneal during fabrication process, they would react with silicon in the substrate to expand the critical dimension of STI and affect the formation of gate structure in the later process. In order to resolve this issue, the present invention first forms a STI around the fin-shaped structure, divides the fin-shaped structure into a first portion and a second portion, and then conducts an ALD process to fill an insulating material between the first portion and the second portion for forming another STI. Since the STI formed by ALD process prevents the aforementioned expansion phenomenon, it would be desirable to use the proposed approach to reduce the critical dimension between cell units and improve current leakage at the same time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    providing a substrate having a fin-shaped structure thereon;
    forming a first shallow trench isolation (STI) around the fin-shaped structure;
    forming a trench in the fin-shaped structure to divide the fin-shaped structure into a first portion and a second portion after forming the first STI around the fin-shaped structure;
    performing an atomic layer deposition (ALD) process to form an insulating layer on the first portion and the second portion and into the trench;
    performing an etching process to remove part of the first STI and the insulating layer for forming a second STI between the first portion and the second portion; and
    forming a gate structure on the second STI, the first portion, and the second portion after forming the first STI, wherein the gate structure on the second STI is extended laterally to cover part of the first portion and part of the second portion of the fin-shaped structure.

2. The method of claim 1, wherein the second STI comprises an overhang.

3. The method of claim 2, wherein the overhang comprises a surface concave upward, and the surface comprises a valley point and two peak points contacting the first portion and the second portion.

4. The method of claim 3, wherein the top surface of the first STI is even with the two peak points of the surface.

5. The method of claim 1, wherein the top surface of the first STI is planar.

6. The method of claim 1, further comprising:
    forming a gate insulating layer on the first portion and the second portion;
    forming a spacer around the gate structure; and
    transforming the gate structure into a metal gate.

7. A semiconductor device, comprising:
    a substrate;
    a fin-shaped structure on the substrate, wherein the fin-shaped structure comprises a first portion and a second portion;
    a first shallow trench isolation (STI) between the first portion and the second portion of the fin-shaped structure, wherein a top surface of the first STI comprises a curve and the curve comprises a surface concave upward, and the surface comprises a valley point and two peak points contacting the first portion and the second portion;
    a second STI around the first portion or the second portion, wherein a top surface of the second STI is even with the two peak points of the surface; and
    a gate structure on the first STI, the first portion, and the second portion, wherein the gate structure on the first STI is extended laterally to cover part of the first portion and part of the second portion of the fin-shaped structure.

8. The semiconductor device of claim 7, further comprising:
    a gate insulating layer on the first portion and the second portion;
    an interfacial layer on sidewalls of the first portion and the second portion; and
    the gate structure on the interfacial layer.

9. The semiconductor device of claim 8, wherein the thickness of the gate insulating layer is greater than the thickness of the interfacial layer.

10. The semiconductor device of claim 8, wherein the gate structure comprises:
    a high-k dielectric layer on the interfacial layer;
    a work function metal layer on the high-k dielectric layer; and
    a low resistance metal layer on the work function metal layer.

11. The semiconductor device of claim 10, wherein the high-k dielectric layer contacts the interfacial layer and the first STI directly.

12. The semiconductor device of claim 7, wherein the top surface of the second STI is a plane surface.

* * * * *